United States Patent
Nakai

(10) Patent No.: US 6,879,036 B2
(45) Date of Patent: Apr. 12, 2005

(54) SEMICONDUCTOR MEMORY DEVICE AND METHOD OF MANUFACTURING SEMICONDUCTOR DEVICE WITH CHIP ON CHIP STRUCTURE

(75) Inventor: Nobuyuki Nakai, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 343 days.

(21) Appl. No.: 10/227,083

(22) Filed: Aug. 22, 2002

(65) Prior Publication Data

US 2003/0040140 A1 Feb. 27, 2003

(30) Foreign Application Priority Data

Aug. 22, 2001 (JP) ........................................ 2001-252055

(51) Int. Cl.⁷ .................... H01L 23/16; H01L 23/48; H01L 21/336; H01L 21/8234
(52) U.S. Cl. ................... 257/723; 257/692; 257/725; 438/268; 438/275; 438/286
(58) Field of Search ................ 257/686–727, 257/786, 787; 438/268–286

(56) References Cited

U.S. PATENT DOCUMENTS

| | | | | | |
|---|---|---|---|---|---|
| 5,332,922 | A | * | 7/1994 | Oguchi et al. | 257/723 |
| 5,474,957 | A | | 12/1995 | Urushima | |
| 5,701,031 | A | * | 12/1997 | Oguchi et al. | 257/686 |
| 6,208,547 | B1 | * | 3/2001 | Ooishi | 365/51 |
| 6,831,294 | B1 | * | 12/2004 | Nishimura et al. | 257/48 |

* cited by examiner

Primary Examiner—Michael Lebentritt
(74) Attorney, Agent, or Firm—Merchant & Gould P.C.

(57) ABSTRACT

A semiconductor memory device for use in a semiconductor device with a chip on chip structure, which enables a memory specification to be selected and fixed, and improves design and production efficiencies. Bonding bumps corresponding to an input terminal and an output terminal of an interface circuit are connected to bonding bumps provided on another semiconductor device. Then, a polarity of a potential on a bus width varying terminal is fixed by the bonding bump provided on another semiconductor device, so that an isolated input/output specification is selected as a bus specification of the interface circuit and a bus width is selected.

10 Claims, 6 Drawing Sheets

SEMICONDUCTOR MEMORY DEVICE AND METHOD OF MANUFACTURING SEMICONDUCTOR DEVICE WITH CHIP ON CHIP STRUCTURE

FIELD OF THE INVENTION

The present invention relates to a semiconductor memory device, such as a dynamic random access memory (DRAM) and a flash memory, for use in a semiconductor device with a so-called chip on chip (COC) structure.

BACKGROUND OF THE INVENTION

Conventionally, the following two structures have been adopted to provide a so-called system LSI on which a memory with a large capacity equal to or more than several M bits mainly is mounted: a single chip structure according to an embedded memory process, in which a logic and a memory are integrated into a single chip; or a single package structure according to a stack structure, in which a logic LSI and a memory LSI are integrated into a single package.

Since the single chip structure according to the embedded memory process allows a logic and a memory on the common semiconductor chip to be connected by a multi-bit bus, a high transfer rate and low power consumption can be realized, and a memory specification can be varied easily in accordance with a demand for a system. However, unfavorably, the process cost is increased.

Moreover, the single package structure according to the stack structure has advantages in cost since a general-purpose memory can be used for a memory LSI. On the other hand, since a wire is required for establishing a connection between the logic LSI and the memory LSI, the single package structure has disadvantages in a transfer rate and power consumption, and in that a memory specification cannot vary in accordance with a demand for a system.

In order to solve the above-mentioned problems relating to the cost, transfer rate and power consumption, a semiconductor device with a so-called chip on chip structure (hereinafter, abbreviated as "COC") has been proposed, in which a memory LSI is bonded and connected to a logic LSI.

However, according to the semiconductor device with a COC structure, when a memory specification as a system LSI varies, a memory LSI also should vary, which lowers the design and production efficiencies.

SUMMARY OF THE INVENTION

Therefore, with the foregoing in mind, it is an object of the present invention to provide a semiconductor memory device for use in a semiconductor device with a COC structure, which enables a memory specification to be selected and fixed, thereby improving design and production efficiencies, and a method of manufacturing a semiconductor device with a COC structure by bonding the above-mentioned semiconductor memory device to the surface of another semiconductor device.

In order to achieve the above-mentioned object, the present invention provides a semiconductor memory device for use in a chip-on-chip structure, which is bonded and connected to another semiconductor device, the device including at least one silicon chip on which a memory array portion for storing data, an address input circuit having an address terminal for accessing the memory array portion and an interface circuit having output and input terminals for reading or writing data with respect to the accessed memory array portion and a bus width varying terminal for varying the number of employed output and input terminals are formed; and bonding bumps formed on a surface corresponding to the address terminal, the output terminal, the input terminal and the bus width varying terminal.

In the semiconductor memory device of the present invention, it is preferable that a timing circuit having a mode setting terminal for externally controlling a timing for accessing the memory array portion is further formed on the at least one silicon chip, and it is preferable that the device further includes a bonding pump formed on a surface corresponding to the mode setting terminal.

Further, in the semiconductor memory device of the present invention, it is preferable that the memory array portion, the address input circuit and the interface circuit are formed on a plurality of chips.

In order to achieve the above-mentioned object, the present invention provides a first method of manufacturing a semiconductor device with a chip on chip structure by bonding a semiconductor memory device to a surface of another semiconductor device. The first manufacturing method includes: forming bonding bumps corresponding to an address terminal, an output terminal, an input terminal and a bus width varying terminal, respectively on a surface of the semiconductor memory device in which a memory array portion for storing data, an address input circuit having the address terminal for accessing the memory array portion and an interface circuit having the output and input terminals for reading or writing data with respect to the accessed memory array portion and the bus width varying terminal for varying the number of employed output and input terminals are formed on at least one silicon chip; and bonding and connecting the semiconductor memory device to the another semiconductor device by matching the bonding bumps to bonding bumps provided on the another semiconductor device, thereby fixing a polarity with respect to the bus width varying terminal by a potential supplied from the another semiconductor device, so that a bus width is selected.

In the first manufacturing method, it is preferable that the bonding bumps corresponding to the output terminal and the input terminal are mutually short-circuited, respectively, on the another semiconductor device in the step of bonding and connecting, so as to define a common input/output specification.

Further, in the first manufacturing method, it is preferable that a polarity of a potential on a part of the address terminals is fixed by the bonding bumps provided on the another semiconductor device in the step of bonding and connecting, so that a memory capacity for accessing the memory array portion is selected.

In order to achieve the above-mentioned object, the present invention provides a second method of manufacturing a semiconductor device with a chip on chip structure by bonding a semiconductor memory device to a surface of another semiconductor device. The second manufacturing method includes: forming bonding bumps corresponding to an address terminal, an output terminal, an input terminal, a bus width varying terminal and a mode setting terminal, respectively on a surface of a semiconductor memory device in which a memory array portion for storing data, an address input circuit having the address terminal for accessing the memory array portion, an interface circuit having the output and input terminals for reading or writing data with respect to the accessed memory array portion and the bus width varying terminal for varying the number of employed output and input terminals and a timing circuit having the mode setting terminal for externally controlling a timing for accessing the memory array portion are formed on at least one silicon chip; and bonding and connecting the semiconductor memory device to the another semiconductor device by matching the bonding bumps to bonding bumps provided on the another semiconductor device, thereby fixing a polarity of a potential on the mode setting terminal by the bonding bumps provided on the another semiconductor device, so that a timing mode of the timing circuit is set.

In order to achieve the above-mentioned object, the present invention provides a chip-on-chip structure, including a semiconductor memory device that is bonded and connected to another semiconductor device, wherein the semiconductor memory device includes at least one silicon chip on which a memory array portion for storing data, an address input circuit having an address terminal for accessing the memory array portion and an interface circuit having output and input terminals for reading or writing data with respect to the accessed memory array portion and a bus width varying terminal for varying the number of employed output and input terminals are formed; and bonding bumps formed on a surface corresponding to the address terminal, the output terminal, the input terminal and the bus width varying terminal.

In the chip-on-chip structure of the present invention, it is preferable to further include a timing circuit having a mode setting terminal for externally controlling a timing for accessing the memory array portion on the at least one silicon chip, and it is preferable that the device further includes a bonding bump formed on a surface corresponding to the mode setting terminal.

Further, in the chip-on-chip structure of the present invention, it is preferable to include a memory array portion, the address input circuit and the interface circuit are formed on a plurality of chips.

The above-mentioned structures and methods enable a memory capacity, a bus specification and a timing specification of the semiconductor memory device to vary, thereby realizing a high transfer rate and low power consumption due to a multi-bit connection, comparable to those of the embedded memory process. Further, a high degree of flexibility in the specifications realizes a good design efficiency, that is, the common semiconductor memory device can be employed for a plurality of system LSIs. Thus, a good production efficiency also can be realized, that is, a mass production can be carried out similarly to a case of employing a general-purpose memory.

Moreover, the production efficiency is further increased by dividing the semiconductor memory device into a plurality of silicon chips, and especially in view of yields, by dividing the memory array portion.

Moreover, the semiconductor memory device can be bonded to another semiconductor device that requires a different memory array capacity, a different bus specification and bus width and a different timing specification of a memory array portion, respectively, even using the same address input circuit, interface circuit and timing circuit.

DETAILED DESCRIPTION OF THE PREFERRED EMBODIMENT

Hereinafter, a preferred embodiment of the present invention will be described with reference to the drawings.

Figure 1:
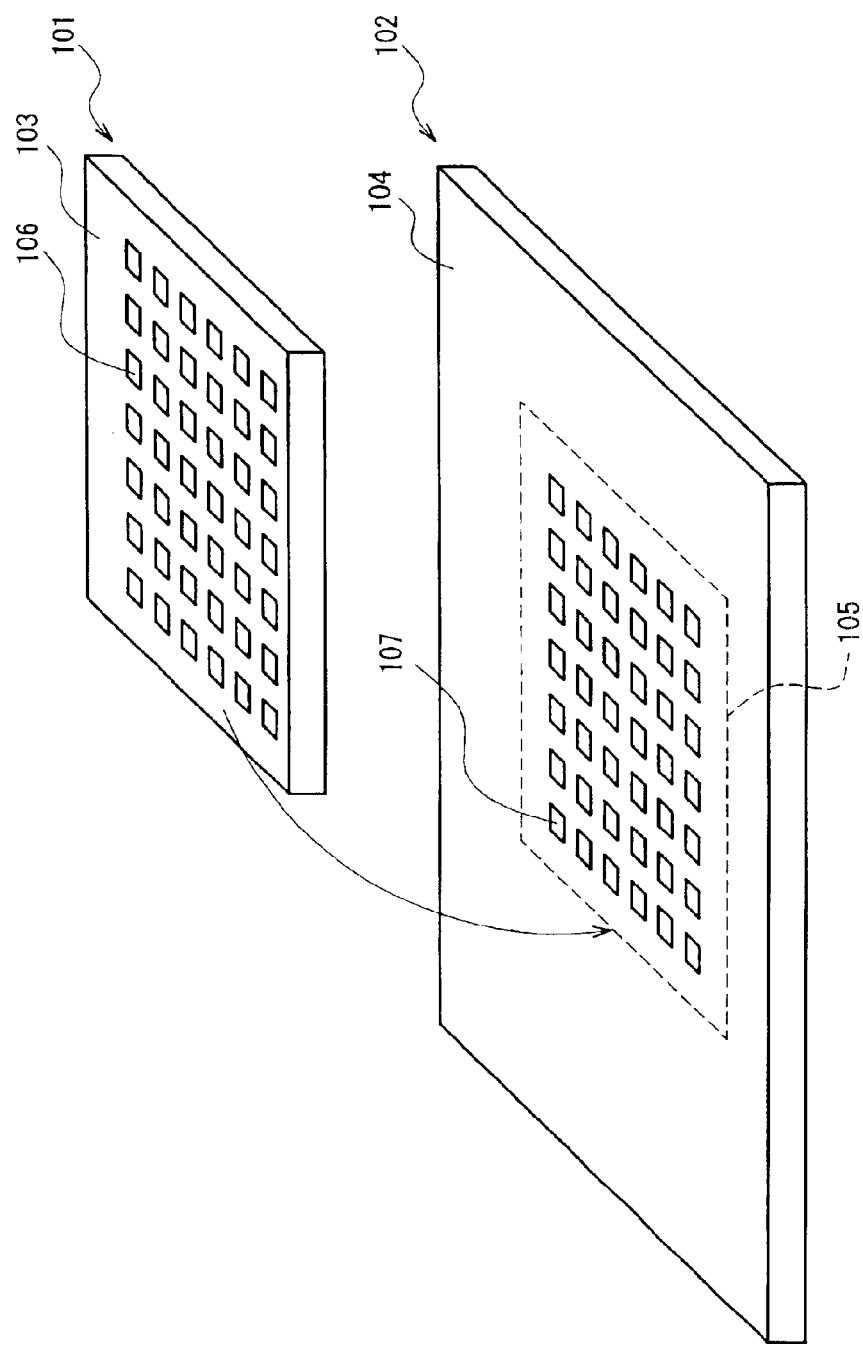
FIG. 1 is a schematic view illustrating a state of bonding a semiconductor memory device according to an embodiment of the present invention to another semiconductor device.

FIG. 1 is a schematic view illustrating a state of bonding a semiconductor memory device according to an embodiment of the present invention to another semiconductor device. In FIG. 1, numeral 101 denotes a semiconductor memory device composed of a single silicon chip. Numeral 102 denotes another semiconductor device such as a logic LSI or the like. Numeral 103 denotes a surface on which functional elements, bonding bumps of the semiconductor memory device 101 are formed. Numeral 104 denotes a surface on which functional elements, bonding bumps of another semiconductor device 102 are formed. Numeral 105 denotes a bonding area. Numerals 106 and 107 denote bonding bumps. The semiconductor memory device 101 composed of a single silicon chip is connected to the bonding area 105 of another semiconductor device 102 by stacking the bonding bumps 106 and 107 on one another.

Figure 2:
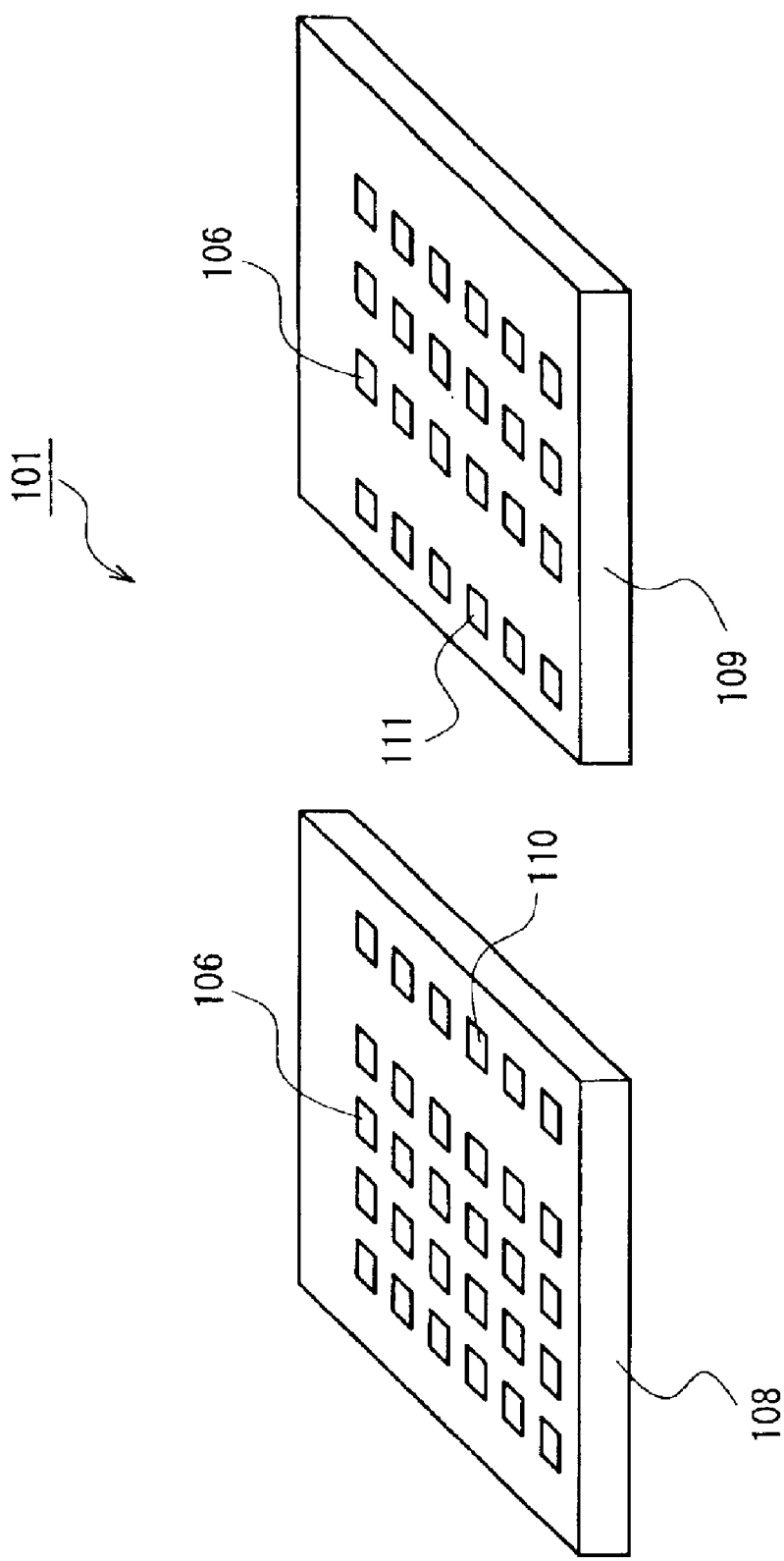
FIG. 2 is a schematic view illustrating a structure in which a semiconductor memory device according to an embodiment of the present invention is divided into two silicon chips.

It should be noted that the semiconductor memory device 101 is not necessarily composed of a single silicon chip, and can be composed of a plurality of silicon chips. FIG. 2 shows an example in which the semiconductor memory device 101 is divided into two silicon chips. In FIG. 2, numerals 108 and 109 denote silicon chips, which are divided according to the function, respectively. Numerals 110 and 111 denote bonding bumps corresponding to divided signal lines.

Hereinafter, unless otherwise specified, the present embodiment will be described with reference to the semiconductor memory device 101 composed of a single silicon chip. However, the same description can be applied to a semiconductor memory device composed of a plurality of silicon chips in FIG. 2. In this case, the connection between the plurality of silicon chips 108 and 109 is established by connecting the exclusive bonding bumps 110 and 111 together via another semiconductor device 102.

Figure 3A:
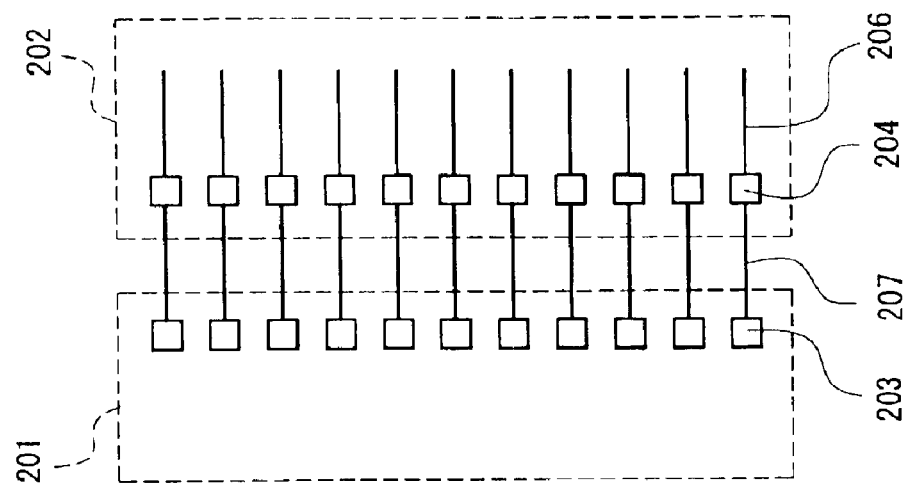
FIG. 3A is a schematic view of an address circuit portion, illustrating a structure in which part of a memory capacity is not used in the state where the semiconductor memory device 101 and another semiconductor device 102 shown in FIG. 1 are bonded together.
Figure 3B:
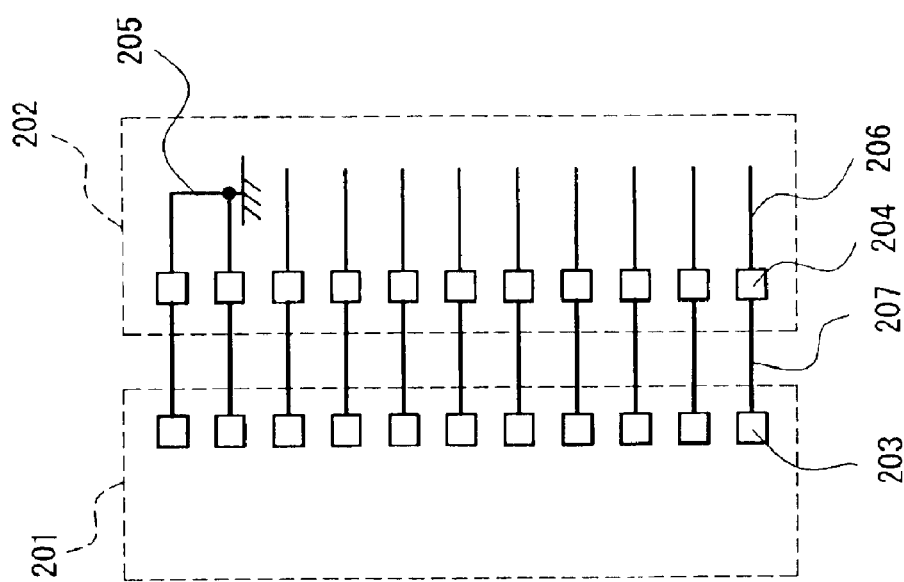
FIG. 3B is a schematic view of the address circuit portion, illustrating a structure in which all of the memory capacity is used in the state where the semiconductor memory device 101 and another semiconductor device 102 shown in FIG. 1 are bonded together.

FIGS. 3A and 3B are schematic views of an address circuit portion, illustrating a state where the semiconductor memory device 101 and another semiconductor device 102 in FIG. 1 are bonded together. It should be noted that FIGS. 3A and 3B illustrate a structure by which a memory capacity of the semiconductor memory device 101 can vary.

In FIGS. 3A and 3B, numeral 201 denotes an area where bonding bumps are formed corresponding to address terminals of an address input circuit of the semiconductor memory device 101. Numeral 202 denotes a bonding area for another semiconductor device 102 with respect to the area 201. Numeral 203 denotes bonding bumps corresponding to the address terminals of the address input circuit.

Numeral 204 denotes bonding bumps corresponding to address signal lines of another semiconductor device 102. Numeral 205 denotes a ground signal line. Numeral 206 denotes address signal lines of another semiconductor device 102. Numeral 207 denotes connections between the bumps.

FIG. 3A illustrates a case where, with respect to some of the address signals, some of the bumps 204 of another semiconductor device 102 are connected to the ground signal line 205, thereby fixing to a state where an unnecessary capacity of the memory array portion is not used. In contrast, FIG. 3B illustrates a case where all the bumps 204 of another semiconductor device 102 are used, thereby using all the capacity of the memory array portion.

Figures 4A, 4B:
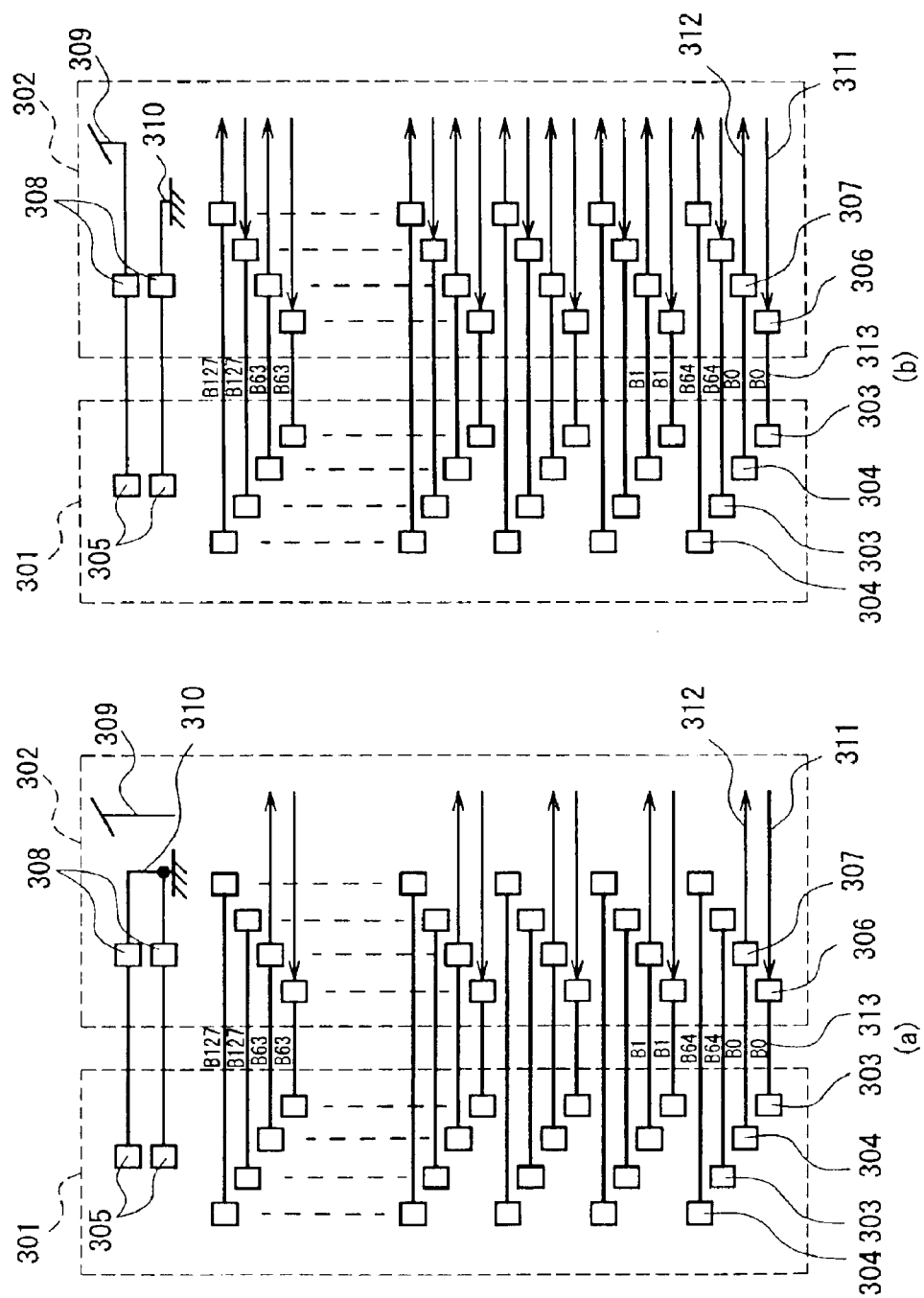
FIG. 4A is a schematic view of an interface circuit portion, illustrating a structure in which a bus specification is set to define an isolated input/output specification with a bus width of 64 bits in the state where the semiconductor memory device 101 and another semiconductor device 102 shown in FIG. 1. are bonded together.
FIG. 4B is a schematic view of the interface circuit portion, illustrating a structure in which a bus specification is set to define an isolated input/output specification with a bus width of 128 bits in the state where the semiconductor memory device 101 and another semiconductor device 102 shown in FIG. 1. are bonded together.

FIGS. 4A and 4B are schematic views of an interface circuit portion, illustrating a state where the semiconductor memory device 101 and another semiconductor device 102 in FIG. 1. are bonded together. It should be noted that FIGS. 4A and 4B illustrate a structure by which a bus specification of the semiconductor memory device 101 is set to define an isolated input/output specification where a bus width can vary, 64 bits or 128 bits.

In FIGS. 4A and 4B, numeral 301 denotes an area where bonding bumps are formed corresponding to input terminals, output terminals and bus width varying terminals of an interface circuit of the semiconductor memory device 101. Numeral 302 denotes an area for bonding the area 301 to another semiconductor device 102. Numeral 303 denotes bonding bumps corresponding to the input terminals of the interface circuit. Numeral 304 denotes bonding bumps corresponding to the output terminals of the interface circuit. Numeral 305 denotes bonding bumps corresponding to the bus width varying terminals of the interface circuit.

Numeral 306 denotes bonding bumps corresponding to data output terminals of another semiconductor device 102. Numeral 307 denotes bonding bumps corresponding to data input terminals of another semiconductor device 102. Numeral 308 denotes bonding bumps for fixing a state in which a bus width of the interface circuit can vary in another semiconductor device 102. Numeral 309 denotes a power source signal line. Numeral 310 denotes a ground signal line. Numeral 311 denotes data output lines of another semiconductor device 102. Numeral 312 denotes data input lines of another semiconductor device 102. Numeral 313 denotes connections between the bumps.

FIGS. 4A and 4B are exemplified as follows. In FIG. 4A, 2 bits of the bus width varying terminals (305) are set to be a logic (L, L) state, and the input terminal (303) and the output terminal (304) are configured to define an isolated input/output specification of 64 bits, and those are formed of the bonding bumps. In FIG. 4B, 2 bits of the bus width varying terminals (305) are set to be a logic (L, H) state, and the input terminal (303) and the output terminal (304) are configured to define an isolated input/output specification of 128 bits, and those are formed of the bonding bumps.

FIG. 4A illustrates the following state. The bonding bumps 308 for holding a state in which the bus width of the interface circuit can vary in another semiconductor device 102 are connected together to the ground signal line 310, to be fixed at a logic (L, L) state. Therefore, the bonding bumps corresponding to the bus width varying terminals of the interface circuit in the semiconductor memory device 101 are also fixed at a logic (L, L) state. As a result, the input terminal (303) and the output terminal (304) are in an isolated input/output specification of 64 bits, respectively.

FIG. 4B illustrates the following state. One of the bonding bumps 308 for fixing a state in which the bus width of the interface circuit can vary in another semiconductor device 102 is connected to the power source signal line 309, and the other is connected to the ground signal line 310, to be fixed at a logic (L, H) state. Therefore, the bonding bumps corresponding to the bus width varying terminals of the interface circuit in the semiconductor memory device 101 are also fixed at a logic (L, H) state. As a result, the input terminal (303) and the output terminal (304) are in an isolated input/output specification of 128 bits, respectively.

Figure 5:
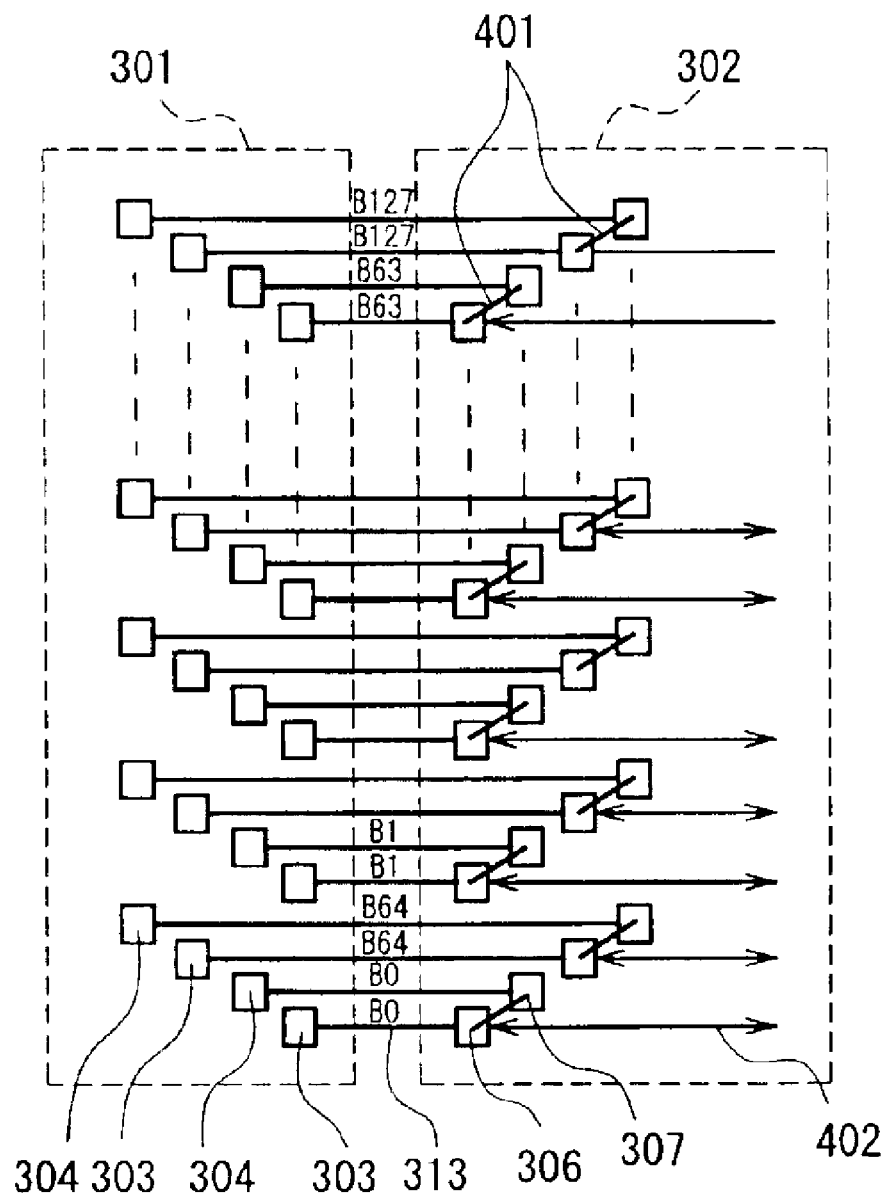
FIG. 5 is a schematic view of the interface circuit portion, illustrating a structure in which a bus specification is set to define a common input/output specification with a bus width of 128 bits in the state where the semiconductor memory device 101 and another semiconductor device 102 shown in FIG. 1. are bonded together.

FIG. 5 is a schematic view of the interface circuit, illustrating a structure in which the semiconductor memory device 101 and another semiconductor device 102 in FIG. 1 are bonded together. It should be noted that FIG. 5 illustrates a structure for setting a bus specification of the semiconductor memory device 101 to define a common input/output specification of 128 bits. In FIG. 5, the same components as those in FIGS. 4A and 4B are designated by the same reference numerals, and the descriptions thereof are omitted.

Numeral 401 denotes short-circuit wiring for short-circuiting the bonding bumps 306 corresponding to the data output terminals and the bonding bumps 307 corresponding to the data input terminals in another semiconductor device 102, thereby setting the bus specification to define a common input/output specification of 128 bits. Numeral 402 denotes a data input/output line of another semiconductor device 102.

Figure 6A:
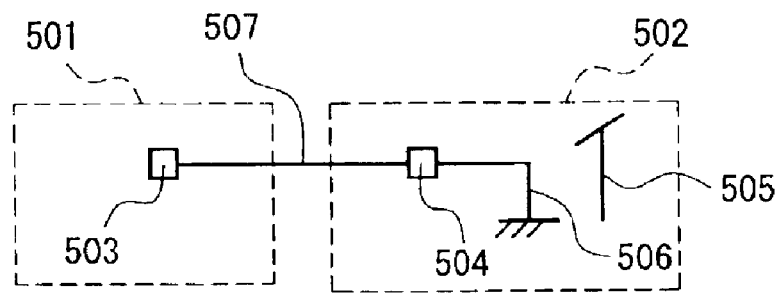
FIG. 6A is a schematic view of a timing circuit portion, illustrating a structure in which one timing mode is set with respect to the semiconductor memory device 101 in the state where the semiconductor memory device 101 and another semiconductor device 102 shown in FIG. 1. are bonded together.
Figure 6B:
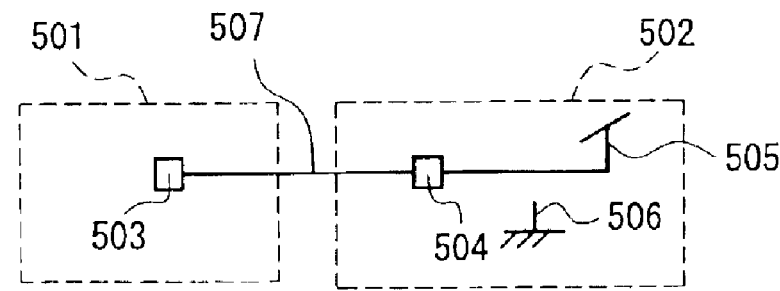
FIG. 6B is a schematic view of the timing circuit portion, illustrating a structure in which another timing mode is set with respect to the semiconductor memory device 101 in the state where the semiconductor memory device 101 and another semiconductor device 102 shown in FIG. 1. are bonded together.

FIGS. 6A and 6B are schematic views of a timing circuit portion, illustrating a state where the semiconductor memory device 101 and another semiconductor device 102 in FIG. 1 are bonded together. It should be noted that FIGS. 6A and 6B illustrate a structure for setting a timing mode with respect to the semiconductor memory device 101.

In FIGS. 6A and 6B, numeral 501 denotes an area where a bonding bump is formed corresponding to a timing mode setting terminal of the semiconductor memory device 101. Numeral 502 denotes an area for bonding the area 501 to another semiconductor device 102. Numeral 503 denotes a bonding bump corresponding to the mode setting terminal of the timing circuit. Numeral 504 denotes a bonding bump for fixing a timing mode with respect to the semiconductor memory device 101 in another semiconductor device 102. Numeral 505 denotes a power source signal line. Numeral 506 denotes a ground signal line. Numeral 507 denotes connections between the bumps.

Here, for example, it is assumed that the mode setting terminal (503) of the timing circuit is set to a logic (L) state or a logic (H) state, thereby realizing two patterns of timing specifications.

In FIG. 6A, the bonding bump 504 for fixing the timing mode with respect to the semiconductor memory device 101 in another semiconductor device 102 is connected to the ground signal line 506, so as to be fixed at the logic (L) state. Therefore, the bonding bump 503 corresponding to the mode setting terminal of the timing circuit also is fixed at the logic (L) state. Consequently, one timing mode is determined.

In FIG. 6B, the bonding bump 504 for fixing the timing mode with respect to the semiconductor memory device 101 in another semiconductor device 102 is connected to the power source signal line 505, so as to be fixed at the logic (H) state. Therefore, the bonding bump 503 corresponding to the mode setting terminal of the timing circuit is also fixed at the logic (H) state. Consequently, the other timing mode is determined.

As described above, according to the present invention, it is possible to vary a memory capacity, a bus specification and a timing specification of the semiconductor memory device, thereby realizing a high transfer rate and low power consumption due to a multi-bit connection, comparable to those of the embedded memory process. Further, a high degree of flexibility in the specifications permits a good design efficiency, that is, the common semiconductor memory device can be employed for a plurality of system LSIs. Thus, a good production efficiency can be also realized, that is, a mass production can be carried out similarly to a case of employing a general-purpose memory.

Moreover, the production efficiency is increased further by dividing the semiconductor memory device into a plurality of silicon chips, and especially in view of yields, by dividing the memory array portion.

Moreover, the semiconductor memory device can be bonded to another semiconductor device that requires a different memory array capacity, a different bus specification and bus width and a different timing specification of a memory array portion, respectively, even using the same address input circuit, interface circuit and timing circuit.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device for use in a chip-on-chip structure, which is bonded and connected to another semiconductor device, the device comprising:

at least one silicon chip on which a memory array portion for storing data, an address input circuit having an address terminal for accessing the memory array portion and an interface circuit having output and input terminals for reading or writing data with respect to the accessed memory array portion and a bus width varying terminal for varying the number of employed output and input terminals are formed; and bonding bumps formed on a surface corresponding to the address terminal, the output terminal, the input terminal and the bus width varying terminal.

2. The semiconductor memory device according to claim 1, wherein a timing circuit having a mode setting terminal for externally controlling a timing for accessing the memory array portion is further formed on the at least one silicon chip, and the device further comprises a bonding bump formed on a surface corresponding to the mode setting terminal.

3. The semiconductor memory device according to claim 1, wherein the memory array portion, the address input circuit and the interface circuit are formed on a plurality of chips.

4. A method of manufacturing a semiconductor device with a chip on chip structure by bonding a semiconductor memory device to a surface of another semiconductor device, the method comprising:

forming bonding bumps corresponding to an address terminal, an output terminal, an input terminal and a bus width varying terminal, respectively on a surface of the semiconductor memory device in which a memory array portion for storing data, an address input circuit having the address terminal for accessing the memory array portion and an interface circuit having the output and input terminals for reading or writing data with respect to the accessed memory array portion and the bus width varying terminal for varying the number of employed output and input terminals are formed on at least one silicon chip; and bonding and connecting the semiconductor memory device to the another semiconductor device by matching the bonding bumps to bonding bumps provided on the another semiconductor device, thereby fixing a polarity with respect to the bus width varying terminal by a potential supplied from the another semiconductor device, so that a bus width is selected.

5. The method of manufacturing a semiconductor device with a chip on chip structure according to claim 4, wherein the bonding bumps corresponding to the output terminal and the input terminal are mutually short-circuited, respectively, on the another semiconductor device in the step of bonding and connecting, so as to define a common input/output specification.

6. The method of manufacturing a semiconductor device with a chip on chip structure according to claim 4, wherein a polarity of a potential on a part of the address terminals is fixed by the bonding bumps provided on the another semiconductor device in the step of bonding and connecting, so that a memory capacity for accessing the memory array portion is selected.

7. A method of manufacturing a semiconductor device with a chip on chip structure by bonding a semiconductor memory device to a surface of another semiconductor device, the method comprising:

forming bonding bumps corresponding to an address terminal, an output terminal, an input terminal, a bus width varying terminal and a mode setting terminal, respectively on a surface of a semiconductor memory device in which a memory array portion for storing data, an address input circuit having the address terminal for accessing the memory array portion, an interface circuit having the output and input terminals for reading or writing data with respect to the accessed memory array portion and the bus width varying terminal for varying the number of employed output and input terminals and a timing circuit having the mode setting terminal for externally controlling a timing for accessing the memory array portion are formed on at least one silicon chip; and bonding and connecting the semiconductor memory device to the another semiconductor device by matching the bonding bumps to bonding bumps provided on the another semiconductor device, thereby fixing a polarity of a potential on the mode setting terminal by the bonding bumps provided on the another semiconductor device, so that a timing mode of the timing circuit is set.

8. A chip-on-chip structure, comprising a semiconductor memory device that is bonded and connected to another semiconductor device, wherein the semiconductor memory device comprises at least one silicon chip on which a memory array portion for storing data, an address input circuit having an address terminal for accessing the memory array portion and an interface circuit having output and input terminals for reading or writing data with respect to the accessed memory array portion and a bus width varying terminal for varying the number of employed output and input terminals are formed; and bonding bumps formed on a surface corresponding to the address terminal, the output terminal, the input terminal and the bus width varying terminal.

9. The chip-on-chip structure according to claim 8, wherein a timing circuit having a mode setting terminal for externally controlling a timing for accessing the memory array portion is further formed on the at least one silicon chip, and the device further comprises a bonding bump formed on a surface corresponding to the mode setting terminal.

10. The chip-on-chip structure according to claim 8, wherein the memory array portion, the address input circuit and the interface circuit are formed on a plurality of chips.

* * * * *